United States Patent
Lin et al.

[11] Patent Number: 6,107,175
[45] Date of Patent: Aug. 22, 2000

[54] METHOD OF FABRICATING SELF-ALIGNED CONTACT

[75] Inventors: Han Lin; Sun-Chieh Chien, both of Hsinchu; Jengping Lin, Taoyuan Hsien, all of Taiwan

[73] Assignee: United Microelectronics Corp., Hsin-Chu, Taiwan

[21] Appl. No.: 09/027,844

[22] Filed: Feb. 23, 1998

[30] Foreign Application Priority Data

Jan. 14, 1998 [TW] Taiwan ................................. 87100404

[51] Int. Cl.[7] ............................................... H01L 21/3205
[52] U.S. Cl. ......................... 438/586; 438/597; 438/647; 438/649
[58] Field of Search .................................. 438/652, 655, 438/649, 630, 651, 642, 586, 597, 647, 625

[56] References Cited

U.S. PATENT DOCUMENTS 5,480,837  1/1996  Liaw et al. ................ 438/626
5,843,815  12/1998  Liaw ......................... 438/647

OTHER PUBLICATIONS

Wolf et al. ( Silicon Processing for the VLSI Era, vol. 1, p. 181, 1986.

*Primary Examiner*—Charles Bowers
*Assistant Examiner*—Hsien-Ming Lee
*Attorney, Agent, or Firm*—Merchant & Gould P.C.

[57] ABSTRACT

A method of a method of fabricating a contact. A substrate having a plurality of gates and a plurality of lightly doped source/drain regions is provided. A dielectric layer is formed and patterned to form a self-align contact window to expose a first lightly doped source/drain region of said lightly doped source/drain regions, and to form a first spacer on a side wall of a first gate of said gates simultaneously. An ion implantation is performed by using the first spacer as a mask, so that a first heavily doped source/drain region is formed in the first lightly doped source/drain region. A doped poly-silicon layer is formed over the substrate, and a metal silicide layer is formed on the doped poly-silicon layer. The doped poly-silicon and the metal silicide layer are patterned to form a self-align contact.

22 Claims, 4 Drawing Sheets

METHOD OF FABRICATING SELF-ALIGNED CONTACT

CROSS-REFERENCE TO RELATED APPLICATION

This application claims priority benefit of Taiwan application Serial no.87100404, filed Jan. 14, 1998, the full disclosure of which is incorporated herein by reference.

BACKGROUND OF THE INVENTION

1. Field of the Invention

The invention relates in general to a metal of fabricating a metal oxide semiconductor (MOS), and more particularly to a method of fabricating a self-align contact (SAC).

2. Description of the Related Art

In the conventional method of fabricating a self-align contact, a silicon oxide layer is formed as a thick cap oxide layer on a poly-silicon layer. With the formation of the thick cap layer, the damage of a gate during the process of forming a self-align contact is prevented.

FIG. 1A to FIG. 1F show the cross sectional views of forming a MOS with a self-align contact. Referring to FIG. 1A, a substrate 100 having a lightly doped P-well, or a P-type semiconductor is provided. A gate 102 is formed on the substrate 100. The gate 102 comprises a gate oxide 104 on the substrate 100, a doped poly-silicon layer 106 on the gate oxide layer 104, a metal silicide layer 107 on the doped poly-silicon layer 106, and a thick cap layer 108, such as a silicon oxide layer on the metal silicide layer 107. The gate oxide layer having a thickness of about 30 Å to 200 Å is formed in an oxygen environment at about 800° C. to 1000° C. The doped poly-silicon layer 106 having a thickness of about 1000 Å to 3000 Å, or even as thick as 1500 Å to 2500 Å, is formed by plasma enhanced chemical vapor deposition (LPCVD). Arsenic ions or phosphorous ions are in-situ doped during the deposition of the poly-silicon layer, or implanted into the poly-silicon layer 106 after the deposition. The metal silicide layer 107 having a thickness of 1000 Å to 3000 Å is tungsten silicide, titanium suicide, or molybdenum silicide. The thick cap layer 108 is a silicon oxide layer formed by chemical vapor deposition. Using the thick cap layer 108 as a mask, the source/drain region 110 is formed by doping, such as doped with N-type arsenic ions or phosphorous ions.

Referring to FIG. 1B, a first dielectric layer 112 is formed over the substrate 100, for example, a silicon oxide layer formed by chemical vapor deposition. Referring to FIG. 1C, anisotropic etching, for example, reactive ion etching, is performed to etch back the first dielectric layer 112. The source/drain region 110 is then exposed, and a spacer 112a on a side wall of the gate 102 is formed. The formation of the spacer 112a is not only a protection structure of the gate 102, but is also advantageous to the formation of heavily doped source/drain region. Using spacer 112a as a mask, a heavily doped source/drain region 114 is formed by heavily doping with, for example, a high concentration of N-type arsenic ions.

Referring to FIG. 1D, a second dielectric layer 116 is formed over the substrate 100, for example, a silicon oxide layer by chemical vapor deposition using a mixture of silane and oxygen as a reactive gas. A photo-resist layer is formed and patterned as the photo-resist layer 117 for the formation of a self-align contact.

Referring to FIG. 1E, the second dielectric layer 116 is etched until exposing the source/drain region 114 to form a self-align contact window 118 which penetrates through the second dielectric layer 116. The etch step is, for example, an anisotropic plasma etch step. The photo-resist layer 117 is then removed.

Referring to FIG. 1F, a doped poly-silicon layer 119 is formed over the substrate 100. Using conventional photolithography to patterned the doped poly-silicon layer 119, a self-align contact 122 is formed.

In the above conventional method, after the spacer is formed by patterning the first poly-silicon layer, the second dielectric layer is formed as a mask for the formation of the contact window. The second dielectric layer is then removed after the formation of the contact. The process is tedious, and the fabrication cost is high due to the waste of material. In case that the second poly-silicon layer is not removed completely during the process of forming a self-align contact, an additional spacer is formed. Consequently, the surface area of the self-align contact window is reduced, and the contact resistance is increased. In addition, since the MOS is formed before the formation of the self-align contact, the doped region is expanded in the subsequent thermal process due to the diffusion of dopant. Therefore, the quality of the devices is degraded.

SUMMARY OF THE INVENTION

It is therefore an object of the invention to provide a method of fabricating a self-align contact. Using only one poly-silicon layer, the spacer is formed while forming a self-align contact. Moreover, the MOS is formed after the formation of the self-align contact. The incomplete removal of the poly-silicon layer is avoided. Thus, the surface area of the contact window is not reduced. Therefore, the process is simplified, the cost is lowered, and the contact resistance is not increased by reducing the surface area of the contact window. On the other hand, the diffusion problem does not occur since the MOS is formed before the formation of the self-align contact.

To achieve these objects and advantages, and in accordance with the purpose of the invention, as embodied and broadly described herein, the invention is directed towards a method of a method of fabricating a contact. A substrate having a plurality of gates and a plurality of lightly doped source/drain regions is provided. A dielectric layer is formed over the substrate. The dielectric layer is patterned and etched to form a self-align contact window to expose a first lightly doped source/drain region of said lightly doped source/drain regions, and to form a first spacer on a side wall of a first gate of said gates simultaneously. An ion implantation is performed by using the first spacer as a mask, so that a first heavily doped source/drain region is formed in the first lightly doped source/drain region. A doped poly-silicon layer is formed over the substrate, and a metal silicide layer is formed on the doped poly-silicon layer. The doped poly-silicon and the metal silicide layer are patterned to form a self-align contact. The first heavily doped source/drain region is either formed by the second ion implantation 213 described above, or is formed by annealing after the formation of the self-align contact 222. During annealing, the dopant within the second doped poly-silicon layer 219 is driven in to the substrate 200 by thermal diffusion, and thus, a first heavily doped source/drain region 214 is formed. That is, the first heavily doped source/drain region 214 is formed before or after the formation of the self-align contact 222 optionally.

DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
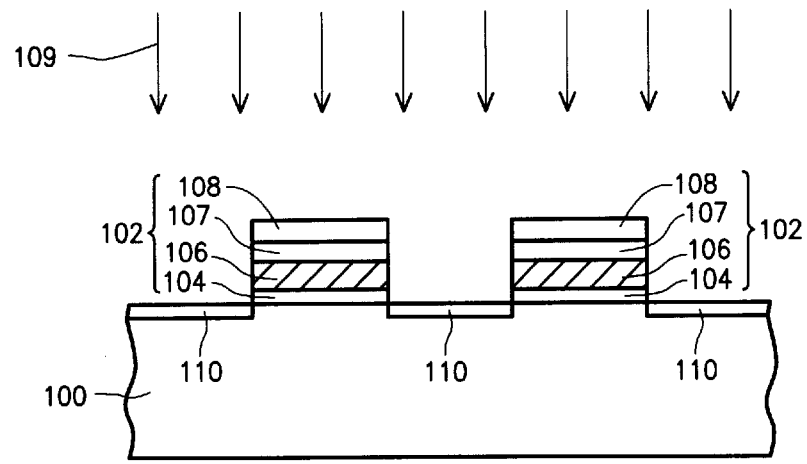
FIGS. 1A to 1F show a conventional method of fabricating a self-align contact.
Figure 1B:
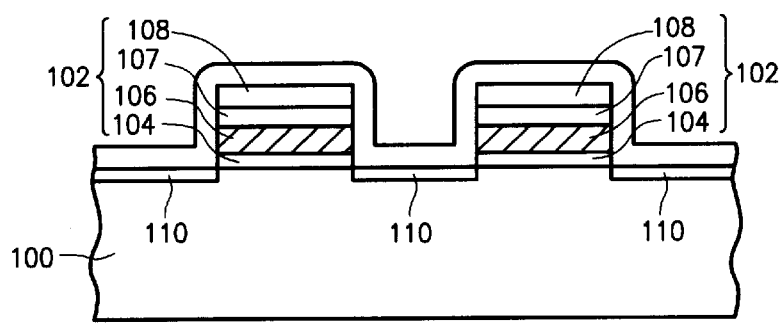
Figure 1C:
Figure 1C:
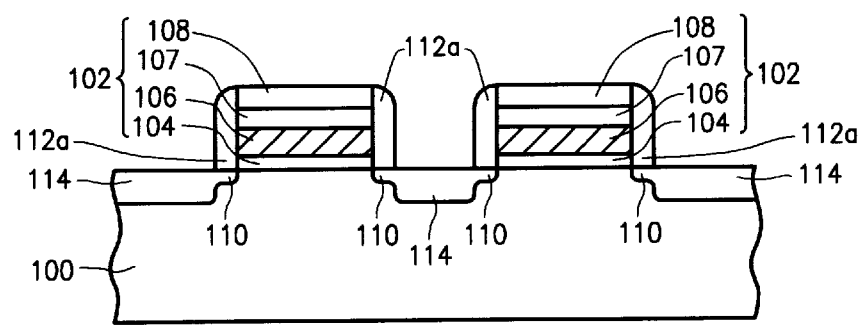
Figure 1D:
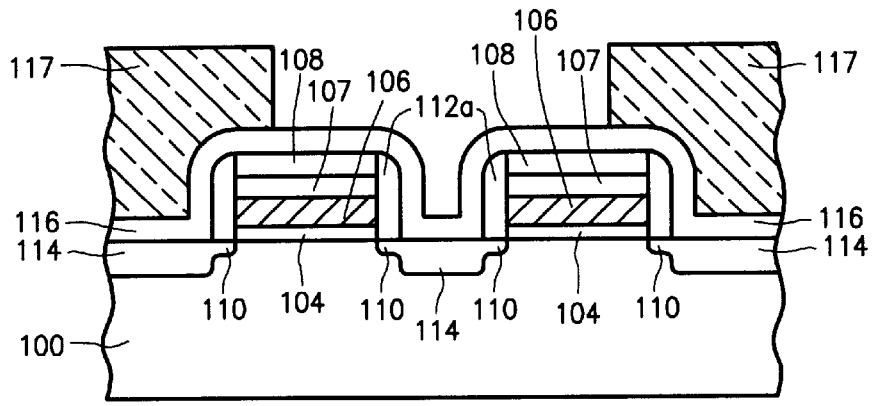
Figure 1E:
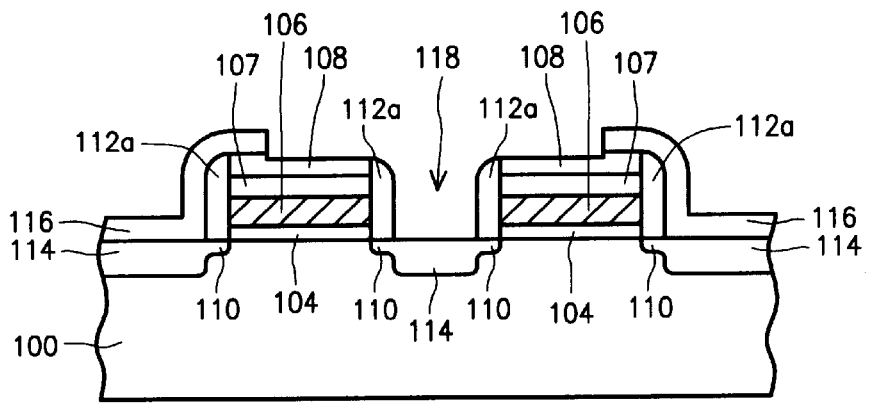
Figure 1F:
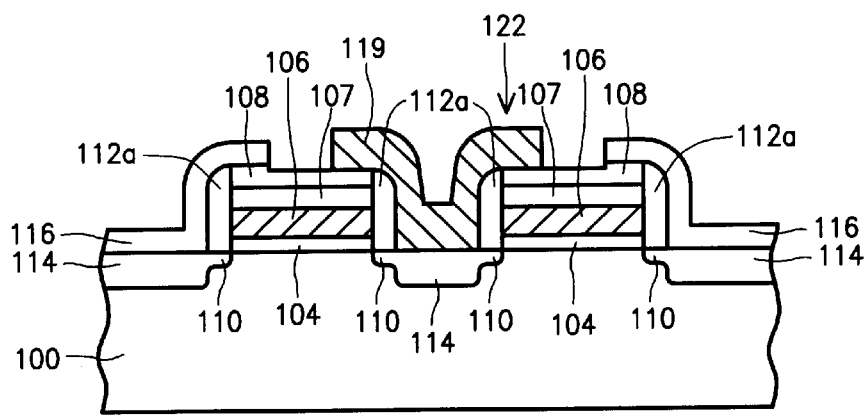
Figure 2A:
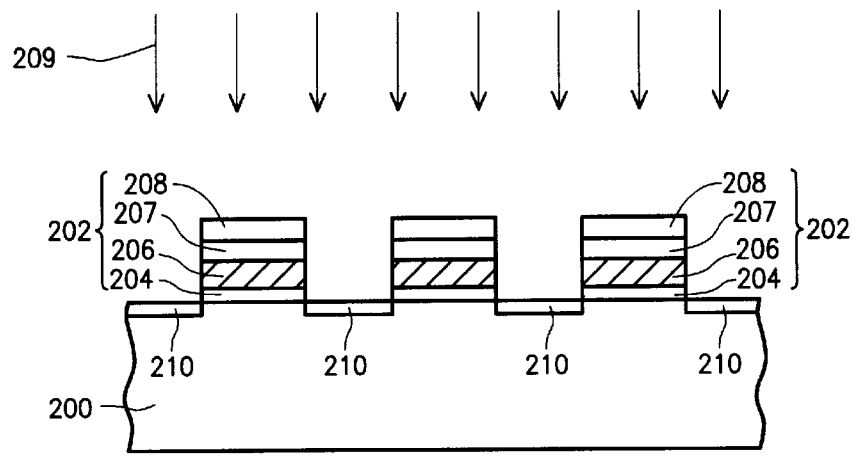
FIGS. 2A to 2E show a method of fabricating a self-align contact in a preferred embodiment according to the invention.

Referring to FIG. 2A, a substrate 200 having a P-well, or a P-type semiconductor is provided. Several gates 202 are formed on the substrate 200. Each of the gates 202 comprises a gate oxide layer 204 on the substrate 200, a doped poly-silicon layer 206 on the gate oxide layer 204, a metal silicide layer 207 formed on the doped poly-silicon layer 206, and a first dielectric layer 208 as a thick cap layer, for example, a silicon oxide layer or a silicon nitride layer, on the metal silicide layer 207. The gate oxide layer having a thickness of about 30 Å to 200 Å is formed in an oxygen environment at about 800° C. to 1000° C. The doped poly-silicon layer 206 having a thickness of about 1000 Å to 3000 Å, or even as thick as 1500 Å to 2500 Å, is formed by plasma enhanced chemical vapor deposition (LPCVD). Arsenic ions or phosphorous ions are in-situ doped during the deposition of the poly-silicon layer 206, or implanted into the poly-silicon layer after the deposition of the poly-silicon layer 206. After doping, a thermal process such as an anneal is performed to activate the doped ions, and thus, the conductivity of the doped poly-silicon layer 206 is improved. The metal silicide layer 207 having a thickness of 1000 Å to 3000 Å is tungsten silicide, titanium silicide, or molybdenum silicide. The thick cap layer 208 is a silicon oxide layer having a thickness of about 1500 Å to 2000 Å formed by chemical vapor deposition. Using the thick cap layer 208 as a mask, several source/drain regions 210 are formed by first ion implantation 209 with N-type arsenic ions or phosphorous ions having a concentration of about $5 \times 10^{12}$ ion/cm$^2$ to $5 \times 10^{13}$ ion/cm$^2$ at 40 KeV to 80 KeV.

Figure 2B:
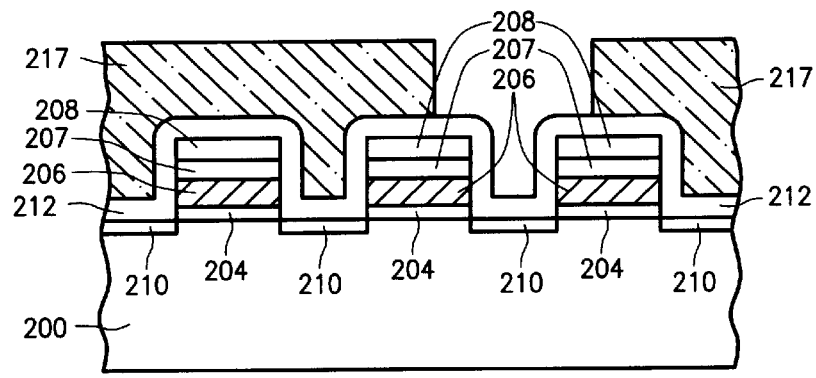
Figure 2C:
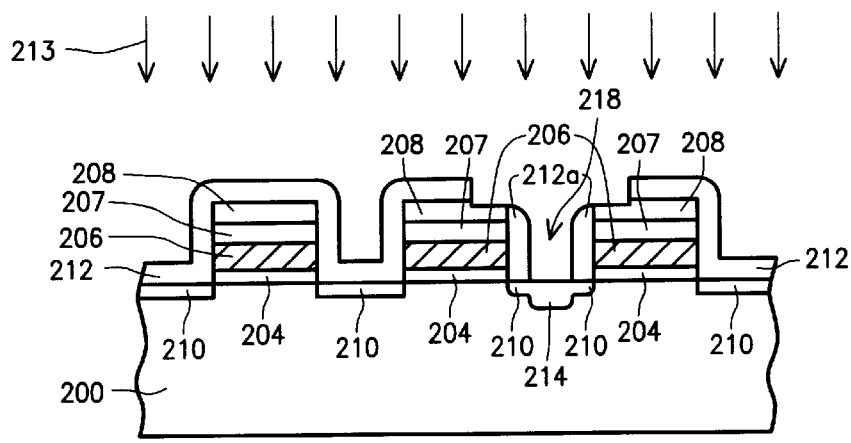

Referring to FIG. 2B, a second dielectric layer 212 having a thickness of 2500 Å is formed over the substrate 200. For example, a silicon oxide layer formed by chemical vapor deposition at about 400° C. to 800° C. A photo-resist layer 217 is formed and patterned to cover the second dielectric layer 212. After exposure and development, a part of the second dielectric layer 212 is removed by etching, for example, by reactive ion etching. A first one of the lightly doped source/drain regions 210 is exposed to form a contact window 218, as shown on FIG. 2C. At the same time, a spacer 212a is formed on the side wall of a first one of the gates 202. The photo-resist layer 217 is removed. Using the spacer 212a and the remaining second poly-silicon layer as a mask, a second ion implantation 213 is performed by a high dosage of arsenic or phosphorous ions, for example, $1 \times 10^{15}$ ion/cm$^2$ to $8 \times 10^{15}$ ion/cm$^2$ at 50 KeV to 80 KeV. A first heavily doped region 214 is thus formed.

Figure 2D:
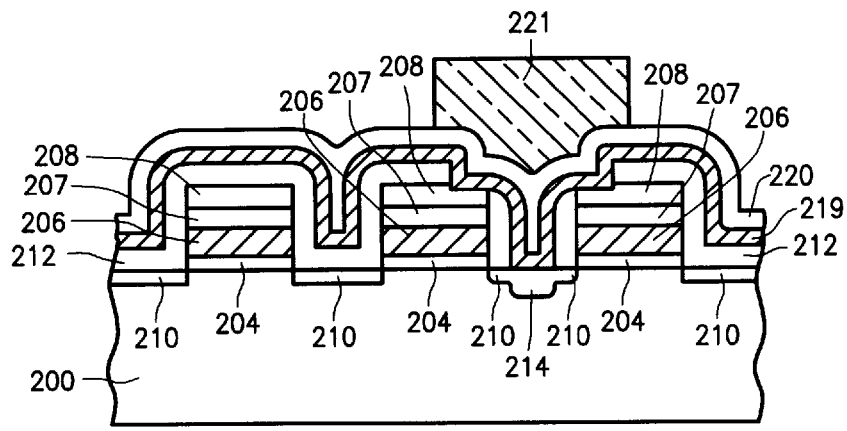

Referring to FIG. 2D, a second doped poly-silicon layer 219 is formed over the substrate 200. A second metal silicide layer 220, for example, tungsten silicide, molybdenum silicide, or titanium silicide, is formed on the second poly-silicon layer 219. The second doped poly-silicon layer 219 is formed, for example, by low pressure chemical vapor deposition. Arsenic ions or phosphorous ions are in-situ doped during the deposition of the poly-silicon layer 219, or implanted into the poly-silicon layer 219 after the deposition. After doping, anneal is performed to activate the doped ions, and thus, the conductivity of the second doped poly-silicon layer 219 is improved. A photo-resist layer 221 is formed and patterned as a mask on the second metal silicide layer 220 to define the self-align contact.

Figure 2E:
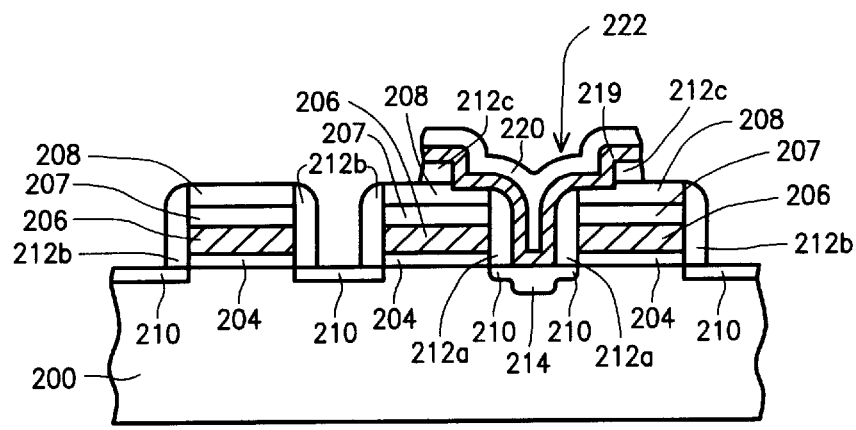

Referring to FIG. 2E, the second doped poly-silicon layer 219 and the second metal silicide layer 220 are patterned to form a self-align contact 222. The first heavily doped source/drain region 214 is either formed by the second ion implantation 213 described above, or is formed by annealing after the formation of the self-align contact 222. During annealing, the dopant within the second doped poly-silicon layer 219 is driven in to the substrate 200 by thermal diffusion, and thus, a first heavily doped source/drain region 214 is formed. That is, the first heavily doped source/drain region 214 is formed before or after the formation of the self-align contact 222 optionally.

Figure 2F:
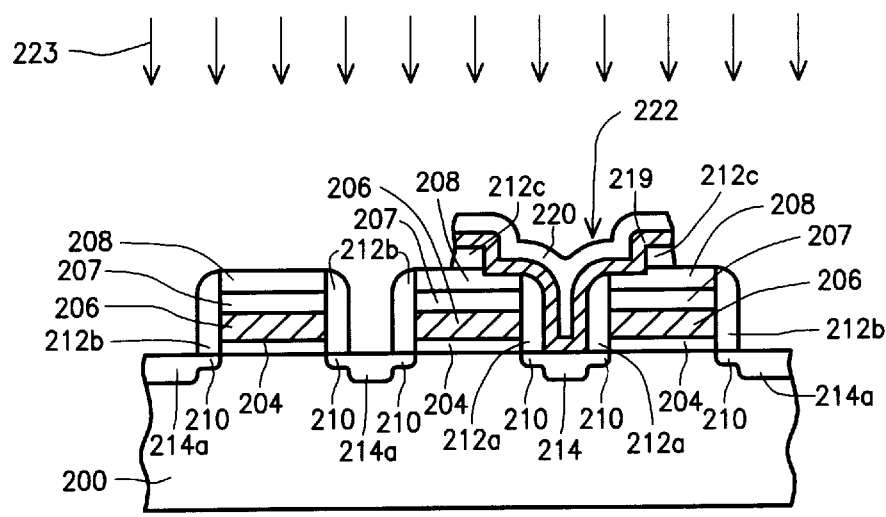

Referring to FIG. 2F, the second dielectric layer 212 is anisotropically etched, for example, by reactive ion etching, to expose a second one of the lightly doped source/drain regions 210. A second spacer 212b is formed on the other side wall of a second one of the gate 202. In addition, the second dielectric layer 212c is remained on the first dielectric layer 208 on the gate 202 for protection. Using the spacer 212b as a mask, a heavily doping process is performed to form a second heavily doped source/drain region 214a for example, by arsenic ions or phosphorous ions with a concentration of about $1 \times 10^{15}$ ion/cm$^2$ to $8 \times 10^{15}$ ion/cm$^2$.

Therefore, the characteristics of the invention are:

1. The self-align contact window is formed with a larger surface area, thus, the contact area is increased, and the contact resistance is reduced.

2. The first and the second spacer are formed in different steps of process. The first spacer is formed during etching the second dielectric layer to form a self-align contact. The second spacer is formed by etching the second dielectric layer after the formation the contact. Thus, the process is simplified.

3. The second dielectric layer can be used as a mask for forming a self-align contact. An additional dielectric layer required for the conventional method is saved in the invention. Thus, the cost of material and production is reduced.

4. The heavily doped source/drain region coupled to the self-align contact, and the heavily doped source/drain region uncoupled to the self-align contact are not formed at the same time. The heavily doped source/drain region coupled to the self-align contact is formed before or after the formation of the self-align contact, whereas the former is formed by ion implantation, and the latter is formed by thermal diffusion. By thermal diffusion, the dopant in the doped poly-silicon layer is driven in the substrate after the formation of the self-align contact on the doped poly-silicon layer or the metal silicide layer, and the heavily doped region is thus formed. The heavily doped region in the heavily doped region uncoupled to the source/drain region is formed by ion implantation with a high concentration of dosage after the formation of the self-align contact.

5. Since the heavily doped source/drain region uncoupled to the self-align contact is formed after the formation of the self-align contact, the damage in the doped region is avoided.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a contact, wherein a substrate having a plurality of gates and a plurality of lightly doped source/drain regions is provided, comprising:

forming a dielectric layer over the substrate;

after forming the dielectric layer, patterning and etching the dielectric layer to form a self-align contact window to expose a first lightly doped source/drain region of said lightly doped source/drain regions, and to form a first spacer on a side wall of a first gate of said gates simultaneously, wherein the first spacer is formed from the dielectric layer;

performing an ion implantation by using the first spacer as a mask, so that a first heavily doped source/drain region is formed in the first lightly doped source/drain region;

forming a doped poly-silicon layer over the substrate, and forming a metal silicide layer on the doped poly-silicon layer; and patterning the doped poly-silicon and the metal silicide layer to form a self-align contact.

2. The method according to claim 1, wherein the dielectric layer is a silicon oxide layer.

3. The method according to claim 1, wherein the dielectric layer is a silicon nitride layer.

4. The method according to claim 1, wherein the dielectric layer is a silicon oxide layer formed by chemical vapor deposition.

5. The method according to claim 1, wherein the dielectric layer is etched by an anisotropic etching.

6. The method according to claim 1, wherein the dielectric layer is etched by a reactive ion etching.

7. The method according to claim 1, wherein each of the gates comprises a gate oxide layer formed on the substrate, a doped poly-silicon layer on the gate oxide layer, a metal silicide layer on the doped poly-silicon layer, and a thick cap oxide layer on the metal silicide layer.

8. The method according to claim 7, wherein the metal silicide layer is a tungsten silicide, a titanium silicide, or a molybdenum silicide.

9. The method according to claim 1, further comprising:

etching the dielectric layer to expose a second lightly doped source/drain region of said light doped source/drain regions, and to form a second spacer on a side wall of the second lightly doped source/drain region; and performing another ion implantation to form a second heavily doped source/drain region in the second lightly doped source/drain region, using the second spacer as a mask.

10. A method of fabricating a contact, wherein a substrate having a plurality of gates and a plurality of lightly doped source/drain regions is provided, comprising:

forming a dielectric layer over the substrate;

after forming the dielectric layer, patterning and etching the dielectric layer to form a self-align contact window to expose a first lightly doped source/drain region of said lightly doped source/drain regions, and to form a first spacer on a side wall of a first gate of said gates simultaneously, wherein the first spacer is formed from the dielectric layer;

forming a doped poly-silicon layer over the substrate, and forming a metal silicide layer on the doped poly-silicon layer;

patterning the doped poly-silicon and the metal silicide layer to form a self-align contact; and performing a thermal process, so that a first heavily doped source/drain region is formed in the first lightly doped source/drain region.

11. The method according to claim 10, wherein the dielectric layer is a silicon oxide layer.

12. The method according to claim 10, wherein the dielectric layer is a silicon nitride layer.

13. The method according to claim 10, wherein the dielectric layer is a silicon oxide layer formed by chemical vapor deposition.

14. The method according to claim 10, wherein the dielectric layer is etched by an anisotropic etching.

15. The method according to claim 10, wherein the dielectric layer is etched by a reactive ion etching.

16. The method according to claim 10, wherein each of the gates comprises a gate oxide layer formed on the substrate, a doped poly-silicon layer on the gate oxide layer, a metal silicide layer on the doped poly-silicon layer, and a thick cap oxide layer on the metal silicide layer.

17. The method according to claim 16, wherein the metal silicide layer is a tungsten silicide, a titanium silicide, or a molybdenum silicide.

18. The method according to claim 10, further comprising:

etching the dielectric layer to expose a second lightly doped source/drain region of said light doped source/drain regions, and to form a second spacer on a side wall of the second lightly doped source/drain region; and performing an ion implantation to form a second heavily doped source/drain region in the second lightly doped source/drain region, using the second spacer as a mask.

19. A method of fabricating a contact, comprising:

providing a substrate having a plurality of gates and a plurality of lightly doped source/drain regions is provided, wherein each of said gates comprises a gate oxide layer on the substrate, a first doped poly-silicon layer on the gate oxide layer, a metal silicide layer on the first doped poly-silicon layer, and a thick cap layer on the metal silicide layer;

forming a dielectric layer over the substrate;

patterning and etching the dielectric layer to form a self-align contact window to expose a first lightly doped source/drain region of said lightly doped source/drain regions, and to form a first spacer on a side wall of a first gate of said gates simultaneously;

performing an ion implantation by using the first spacer as a mask, so that a first heavily doped source/drain region is formed in the first lightly doped source/drain region;

forming a second doped poly-silicon layer over the substrate, and forming a metal silicide layer on the second doped poly-silicon layer;

patterning the second doped poly-silicon and the metal silicide layer to form a self-align contact;

etching the dielectric layer to expose a second lightly doped source/drain region of said light doped source/drain regions, and to form a second spacer on a side wall of the second lightly doped source/drain region; and performing another ion implantation to form a second heavily doped source/drain region in the second lightly doped source/drain region, using the second spacer as a mask.

20. A method of fabricating a contact, comprising;

providing a substrate having a plurality of gates and a plurality of lightly doped source/drain regions is provided, wherein each of said gates comprises a gate oxide layer on the substrate, a first doped poly-silicon layer on the gate oxide layer, a metal silicide layer on the first doped poly-silicon layer, and a thick cap layer on the metal silicide layer;

patterning and etching the dielectric layer to form a self-align contact window to expose a first lightly doped source/drain region of said lightly doped source/drain regions, and to form a first spacer on a side wall of a first gate of said gates simultaneously;

forming a doped poly-silicon layer over the substrate, and forming a metal silicide layer on the doped poly-silicon layer;

patterning the doped poly-silicon and the metal silicide layer to form a self-align contact;

performing a thermal process, so that a first heavily doped source/drain region is formed in the first lightly doped source/drain region;

etching the dielectric layer to expose a second lightly doped source/drain region of said light doped source/drain regions, and to form a second spacer on a side wall of the second lightly doped source/drain region; and performing another ion implantation to form a second heavily doped source/drain region in the second lightly doped source/drain region, using the second spacer as a mask.

21. A method of fabricating a contact, wherein a substrate having a plurality of gates and a plurality of lightly doped source/drain regions is provided, comprising:

forming a dielectric layer over the substrate;

patterning and etching the dielectric layer to form a self-align contact window to expose a first lightly doped source/drain region of said lightly doped source/drain regions, and to form a first spacer on a side wall of a first gate of said gates simultaneously;

performing an ion implantation by using the first spacer as a mask, so that a first heavily doped source/drain region is formed in the first lightly doped source/drain region;

forming a doped poly-silicon layer over the substrate, and forming a metal silicide layer on the doped poly-silicon layer;

patterning the doped poly-silicon and the metal silicide layer to form a self-align contact;

etching the dielectric layer to expose a second lightly doped source/drain region of said light doped source/drain regions, and to form a second spacer on a side wall of the second lightly doped source/drain region; and performing another ion implantation to form a second heavily doped source/drain region in the second lightly doped source/drain region, using the second spacer as a mask.

22. A method of fabricating a contact, wherein a substrate having a plurality of gates and a plurality of lightly doped source/drain regions is provided, comprising:

forming a dielectric layer over the substrate;

patterning and etching the dielectric layer to form a self-align contact window to expose a first lightly doped source/drain region of said lightly doped source/drain regions, and to form a first spacer on a side wall of a first gate of said gates simultaneously;

forming a doped poly-silicon layer over the substrate, and forming a metal silicide layer on the doped poly-silicon layer;

patterning the doped poly-silicon and the metal silicide layer to form a self-align contact;

performing a thermal process, so that a first heavily doped source/drain region is formed in the first lightly doped source/drain region;

etching the dielectric layer to expose a second lightly doped source/drain region of said light doped source/drain regions, and to form a second spacer on a side wall of the second lightly doped source/drain region; and performing an ion implantation to form a second heavily doped source/drain region in the second lightly doped source/drain region, using the second spacer as a mask.

* * * * *